(12) United States Patent
Smith

(10) Patent No.: US 6,469,578 B1
(45) Date of Patent: Oct. 22, 2002

(54) DIFFERENTIAL CURRENT MODE GAIN STAGE AND METHODS OF USING THE SAME

(75) Inventor: Steven Obed Smith, Loveland, CO (US)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 09/863,574

(22) Filed: May 23, 2001

(51) Int. Cl.[7] .............................................. H03F 3/45
(52) U.S. Cl. ...................... 330/252; 330/258; 330/259; 330/261; 330/255
(58) Field of Search ................................ 320/252, 255, 320/258, 259, 261

(56) References Cited

U.S. PATENT DOCUMENTS 5,706,236 A * 1/1998 Yamamoto ................... 365/205

6,184,750 B1 * 2/2001 Somerville ................... 330/255

OTHER PUBLICATIONS

"A Wide–Band Operational Amplifier With a New Output Stage and a Simple Frequency Compensation," Rudy J. van De Plassche; *IEEE Journal of Solid–State Circuits*, vol. SC–6, No. 6, Dec. 1971, pp. 347–352.

* cited by examiner

*Primary Examiner*—Michael B Shingleton
(74) *Attorney, Agent, or Firm*—Skjerven Morrill LLP; Alex C. Chen

(57) ABSTRACT

A differential current mode gain stage and methods of using the same are provided. The gain stage may comprise a plurality of transistors. The gain stage is configured to keep at least one transistor of the plurality of transistors out of saturation mode while operating with a supply voltage of less than two base-emitter voltages, receiving an input signal, generating a first output signal if the input signal comprises a common mode signal, and generating a second output signal if the input signal comprises a differential signal, the second output signal having a larger amplitude than the first output signal.

17 Claims, 6 Drawing Sheets

Expected Performance (Av+2, Rflg 5k)

| AC Response | +1.2V | +2.7V | +5V | +/-2.5V | units |
|---|---|---|---|---|---|
| Av+1 | | | | 40 | MHz |
| Av+2 | 23 | 24 | 24 | 24 | MHz |
| GBW | | | | 30 | MHz |
| | | | | | |
| Transient | | | | | |
| ss rise/fall | 15 | 15 | 15 | 15 | ns |
| slew rate | 8 | 8 | 8 | 8 | V/us |
| | | | | | |
| V Noise | | | | 11.5 | nV/Hz |
| | | | | | |
| DC Performance | | | | | |
| Icc | 640 | 750 | 750 | 750 | uA typical |
| | 750 | 920 | 950 | 850 | uA maximum |
| Vos | 0.5 | 0.75 | 1.0 | 0.5 | mV typical |
| | 2 | 2 | 3 | 2 | +/-mV maximum |
| Ib | | | | -400 | nA typical |
| | | | | -800 | nA maximum |
| Ao | 63 | 66 | 67 | 69 | dB |
| CMRR | 70 | 73 | 73 | 73 | dB |
| CM input range | Vee-0.4 to Vcc-1.0 (typical) | | | | |
| PSRR (1.3 to 5) | | | 74 | | dB |
| Vo swing + | 0.15 | 0.15 | 0.2 | 0.15 | V from Vcc |
| Vo swing - | 0.07 | 0.05 | 0.05 | 0.05 | V from Vee |
| Iout (linear) | 1 | 7 | 7 | 7 | +/-mA typical |
| | 0.6 | | | | +/-mA minimum |
| Iout (short) | | | | 8 | +/-mA typical |
| | | | | 11 | +/-mA maximum |

DIFFERENTIAL CURRENT MODE GAIN STAGE AND METHODS OF USING THE SAME

BACKGROUND OF THE INVENTION

1. Field of the Invention

The present invention relates to electronic circuits, and more particularly to a differential current mode gain stage and methods of using the same.

2. Description of the Related Art

Conventional operational amplifiers (op amps) comprise a plurality of transistors and one or more resistors and capacitors.

SUMMARY OF THE INVENTION

A differential input, differential output, current mode gain stage and methods of using the same are provided in accordance with the present invention. The differential current mode gain stage provides a high gain for differential input signals and a low gain for common mode signals.

Some conventional op amps require a supply voltage of at least two base-emitter voltages, which is about 1.5 volts (2×0.75 volts). One embodiment of the differential current mode gain stage in accordance with the present invention advantageously allows input and output voltages to be close to a supply voltage. In one embodiment, the differential current mode gain stage may be implemented in a bipolar, low-voltage op amp that operates with a single-supply voltage that is less than two base-emitter voltages across various process and temperature conditions. The ability of the differential current mode gain stage (and the op amp as a whole) to use such a low supply voltage provides a significant advantage over conventional op amps because it is desirable to minimize power consumption.

Another advantage of using the differential current mode gain stage in a single-supply op amp is a reduction in active circuitry. In one embodiment, the differential current mode gain stage allows a single-supply op amp to comprise about 12 transistors (excluding bias devices) instead of about 30 transistors.

Another advantage of the differential current mode gain stage is keeping active transistors from saturating while generating large signals. This advantage is important because transistors in op amps may be operated near saturation.

One aspect of the invention relates to a gain stage in an amplifier. The gain stage comprises a plurality of transistors. The gain stage is configured to keep at least one transistor of the plurality of transistors out of saturation mode while operating with a supply voltage of less than two base-emitter voltages, receiving an input signal, generating a first output signal if the input signal comprises a common mode signal, and generating a second output signal if the input signal comprises a differential signal, the second output signal having a larger amplitude than the first output signal.

Another aspect of the invention relates to a method of providing a signal gain. The method comprises operating with a supply voltage of less than two base-emitter voltages; generating a first output signal if an input signal comprises a common mode signal; generating a second output signal if the input signal comprises a differential signal, wherein the second output signal has a larger amplitude than the first output signal; and keeping the at least one transistor in a circuit out of saturation mode while generating the first and second output signals.

BRIEF DESCRIPTION OF THE DRAWINGS

FIG. 7 is a table of values associated with one embodiment of the op amp in FIG. 1.

DETAILED DESCRIPTION

Figure 1:
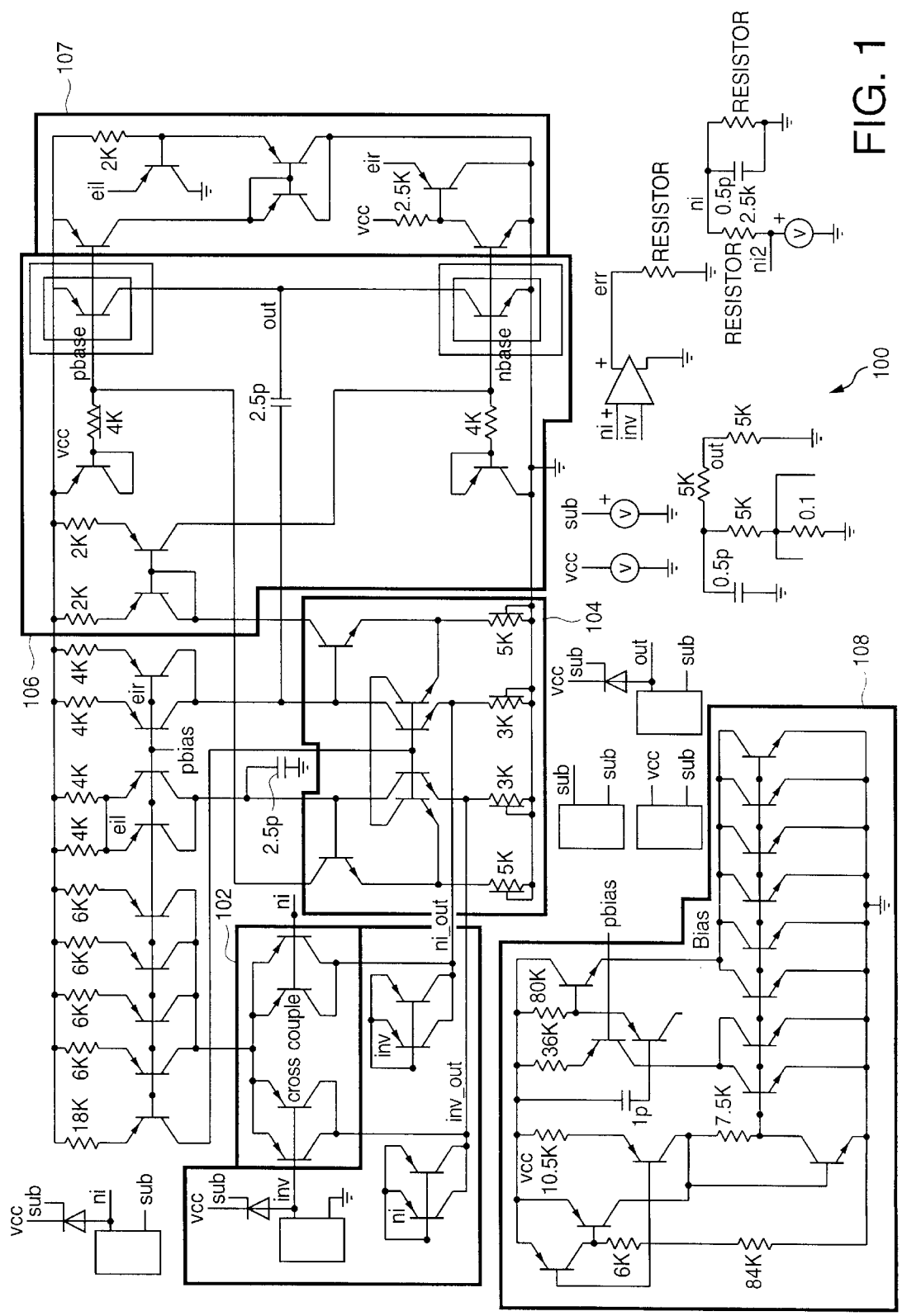
FIG. 1 illustrates one embodiment of a low-voltage op amp in accordance with the invention.

FIG. 1 illustrates one embodiment of a low-voltage operational amplifier (op amp) 100 in accordance with the invention. The op amp 100 in FIG. 1 comprises an input stage 102, an intermediate stage 104, an output stage 106, a bias circuit 108 and other components, such as transistors and resistors, for biasing, buffering, filtering and/or other functions. Other embodiments of the op amp 100 may comprise other components in addition to or instead of the components shown in FIG. 1. For example, in one embodiment, field-effect transistors (FETs) may be used in addition to or instead of the bipolar junction transistors (BJTs) shown in FIGS. 1–5.

In one embodiment, the op amp 100 in FIG. 1 comprises a bipolar, single-supply op amp with a rail-to-rail output and an input common mode range that includes ground. "Rail to rail output" means that the op amp output is capable of a linear swing to within millivolts of the supply voltage (Vcc) and ground. "Input common mode range" is the range of common-mode voltages over which the input stage 102 remains in linear active mode.

In one embodiment, the op amp 100 is configured to operate with a single-supply voltage (Vcc) less than two base-emitter voltages across a range of process and temperature conditions. In one embodiment, the single-supply voltage is about 1.2V. In other embodiments, the op amp 100 is configured to operate with a single-supply voltage of about 1.0V or lower. In one embodiment, the input stage 102, the intermediate stage 104 and the output stage 106 are all biased with the same supply voltage Vcc.

In one embodiment, the op amp 100 is short-circuit protected and has a total supply current of about 750 uA. In one embodiment, the op amp 100 is implemented on a silicon substrate.

Figure 2:
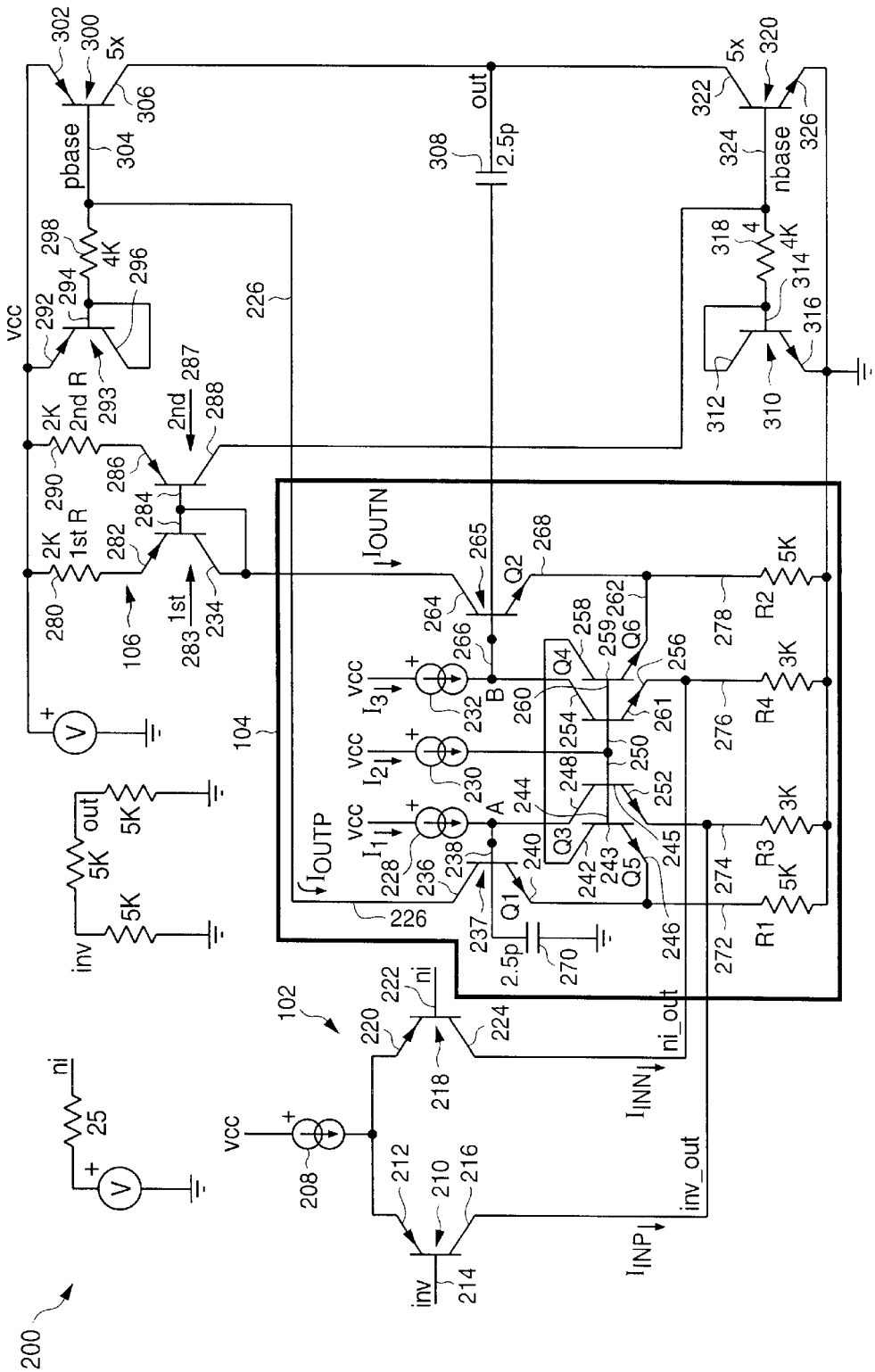
FIG. 2 illustrates a simplified circuit diagram of the low-voltage op amp in FIG. 1.

FIG. 2 illustrates a simplified circuit diagram of the low-voltage op amp 100 in FIG. 1. This simplified circuit diagram depicts a circuit 200, which comprises the input stage 102, intermediate stage 104 and output stage 106 shown in FIG. 1. The intermediate stage 104 may also be referred to as a "differential current mode gain stage 104." Other embodiments of the circuit 200 may have additional stages.

Input Stage

The input stage 102 in FIG. 2 comprises a current source 208 coupled to voltage source Vcc, a first transistor 210 and a second transistor 218. In one embodiment, the first and second transistors 210, 218 comprise pnp bipolar junction transistors (BJTs). The first and second transistors 210, 218 may be referred to as a pnp differential pair. In one embodiment, the current source 208 comprises a 34-uA current source, which generates a current that may be split among the emitter terminals 212, 220 of the transistors 210, 218, depending on the voltages of the base terminals 214, 222.

The base terminal 214 of the first transistor 210 in the input stage 102 receives an inverting input ("inv") of the op amp 100. The base terminal 222 of the second transistor 218 in the input stage 102 receives a non-inverting input ("ni") of the op amp 100. The collector terminal 216 of the first transistor 210 provides a first input current $I_{INP}$ at an emitter terminal 252 of a transistor 245 of the differential current mode gain stage 104. The collector terminal 224 of the second transistor 218 provides a second input current $I_{INN}$ at an emitter terminal 256 of a transistor 261 of the differential current mode gain stage 104. Thus, the first and second transistors 210, 218 of the input stage 102 drive the intermediate stage 104 with the input currents $I_{INP}$ and $I_{INN}$.

Differential Current Mode Gain Stage

The differential current mode gain stage 104 in FIG. 2 comprises a first current source 228, a second current source 230, a third current source 232, a first high impedance node A, a second high impedance mode B, a first transistor (Q1) 237, a second transistor (Q2) 265, a third transistor (Q3) 245, a fourth transistor (Q4) 261, a fifth transistor (Q5) 243, a sixth transistor (Q6) 259, a first resistor (R1) 272, a second resistor (R2) 278, a third resistor (R3) 274, a fourth resistor (R4) 276 and a capacitor 270. In other embodiments, the differential current mode gain stage 104 may comprise other components in addition to or instead of the components shown in FIG. 2. In other embodiments, the differential current mode gain stage 104 may comprise less components than the components shown in FIG. 2.

The first, second and third current sources 228, 230, 232 in FIG. 2 are coupled to common supply voltage Vcc. In one embodiment, the first and third current sources 228, 232 each provide 23 uA of current, and the second current source 230 provides 4 uA of current, respectively. In other embodiments, the first, second and third current sources 228, 230, 232 provide other amounts of current instead of 23 uA and 4 uA. In one embodiment, the current sources 228, 230, 232 are constant. In another embodiment, the current sources 228, 230, 232 are variable. In one embodiment, the current sources 228, 230, 232 provide direct current.

In one embodiment, the transistors Q1–Q6 in the differential current mode gain stage 104 are npn BJTs. In one embodiment, the resistors R1, R2 have a resistance of 5 kohms, and the resistors R3, R4 have a resistance of 3 kohms. In one embodiment, the capacitor 270 comprises a 2.5 picofarad capacitance. In other embodiments, the resistors R1–R4 and the capacitor 270 may have other values.

The first high impedance node A in FIG. 2 is coupled to the base terminal 238 of the transistor Q1 and the collector terminal 248 of the transistor Q3. The second high impedance node B is coupled to the base terminal 266 of the transistor Q2 and the collector terminal 254 of the transistor Q4. The current source 230 is coupled to the base terminals 244, 250, 260 of the transistors Q3, Q4, Q5, Q6 and the collector terminals 242, 258 of the transistors Q5, Q6. The transistors Q5, Q6 in FIG. 2 are configured as diodes with the base terminals 244, 260 coupled to the collector terminals 242, 258.

The differential current mode gain stage 104 in FIG. 2 provides a high differential gain and a controlled common mode level at the first and second high impedance nodes A and B, as described below. The differential current mode gain stage 104 also keeps the transistors Q3, Q4 out of saturation during normal operation.

Output Stage

The output stage 106 in FIG. 2 comprises a first resistor 280, a second resistor 290, a first transistor 283, a second transistor 287, a third transistor 293, a third resistor 298, a first output transistor 300, a capacitor 308, a fourth transistor 310, a fourth resistor 318 and a second output transistor 320. In one embodiment, the first, second and third transistors 283, 287, 293 comprise pnp transistors, and the fourth transistor 310 comprises a npn transistor. The first, third and fourth transistors 283, 293, 310 are configured as diodes with the base terminals 284, 294, 314 coupled to the collector terminals 234, 296, 312. In one embodiment, the first output transistor 300 comprises a pnp transistor, and the second output transistor 320 comprises a npn transistor.

In one embodiment, resistors 280, 290 each comprise a 2-kohm resistor, and resistors 298, 318 each comprise a 4-kohm resistor. The resistors 280, 290, 298 in FIG. 2 are coupled between the diode-configured, first transistor 283 and the first output transistor 300 and are configured to increase open loop gain.

Common Mode Level Control

Bias is set up via a "common mode feedback loop" or a "common mode bias circuit," which comprises the transistors Q1–Q6. If the voltage levels at nodes A and B are substantially equal, the diode-configured transistors Q5, Q6 will conduct substantially the same amount of current.

If the current sources 228, 232 provide more current than the transistors Q3, Q4 can conduct, the voltage levels at nodes A and B will increase. The voltage levels of the emitter terminals 240, 268 of transistors Q1, Q2 will also increase. Higher voltage levels at the emitter terminals 240, 268 of the transistors Q1, Q2 (and nodes A and B) will "pull up" the transistors Q5, Q6 because the emitter terminals 246, 262 of the transistors Q5, Q6 are coupled to the emitter terminals 240, 268 of the transistors Q1, Q2, respectively. The pull up of the transistors Q5, Q6 forces the voltage levels at the base terminals 244, 250, 260 of the transistors Q3–Q6 to increase.

The increased voltage level at the base terminals 244, 250, 260 of the transistors Q3–Q6 causes the current entering the collector terminals 248, 254 of the transistors Q3, Q4 to increase. The increase in collector currents of the transistors Q3, Q4 provides negative feedback. The feedback forces the transistors Q3, Q4 to conduct all of the current provided by the current sources 228, 232 (ignoring base currents of the transistors Q1, Q2). As the collector currents of the transistors Q3, Q4 increase, the voltage levels of nodes A and B are pulled back down. Thus, the common mode feedback loop closes with a correct sign.

The common mode feedback loop forces the sum of the collector current of the transistor Q3 and the base current of the transistor Q1 to be equal to the first current source 228, $I_{c3}+I_{b1}=I_1$. The common mode feedback loop also forces the sum of the collector current of the transistor Q4 and the base current of the transistor Q2 to be equal o the third current source 232, $I_{c4}+I_{b2}=I_3$.

Common Mode Gain

In common mode operation, the input stage 102 in FIG. 2 may force a common mode input current (e.g., $I_{INP}$ and $I_{INN}$ are in phase and have the same sign) (also called a "common mode signal") into the emitter terminals 252, 256 of the transistors Q3, Q4 in the intermediate stage 104. A common mode current can be observed at nodes A and B.

The current sources 228, 232 can be fixed, so the common mode current is forced into the base terminals 238, 266 of the transistors Q1, Q2, which affects the voltages at nodes A and B.

The common mode signal increases the voltage drop across the resistors R3 and R4 because the currents in the transistors Q3, Q4 are fixed by the common mode feedback loop. Thus, substantially all of the input currents $I_{INP}$ and $I_{INN}$ flow into the resistors R3, R4. The common mode feedback loop forces the same voltage drop to appear across the resistors R1, R2, which increases the output currents $I_{OUTP}$ and $I_{OUTN}$. If R4=R3 and R2=R1, the common mode gain is equal to R3/R1.

Differential Input Current and Small Signal Differential Gain

In a common mode feedback circuit (not shown) with a plurality of transistors, if a differential input current is applied to two input nodes of the circuit, e.g., a voltage level at a first input node increases while a voltage level at a second input node decreases, the common mode level of the circuit does not change significantly. If low collector-emitter voltages (Vces) are required in the common mode feedback circuit, then one or more of the transistors in the circuit may saturate.

In one embodiment of the circuit 200 in FIG. 2, low collector-emitter voltages (Vces) are desired without causing one or more transistors, e.g., the transistors Q3, Q4, to saturate.

In differential gain mode, the input stage 102 in FIG. 2 may force a small differential input current (e.g., $I_{INP}$ and $I_{INN}$ are out of phase and/or one is greater in amplitude than the other) into the emitter terminals 252, 256 of the transistors Q3, Q4. The current sources 228, 232 can be fixed, so the differential current is forced into the base terminals 238, 266 of the transistors Q1, Q2, which affects the voltages at nodes A and B.

For example, if $I_{INP}$ is greater than $I_{INN}$, the voltage level at node A may increase slightly, while the voltage level at node B may decrease slightly. The different voltage levels at nodes A and B cause the emitter terminals 240, 268 of the transistors Q1 and Q2, and hence the emitter terminals 246, 262 of the transistors Q5 and Q6, to have different voltage levels. The higher voltage level at the emitter terminal 246 of transistor Q5 causes the current from the current source 230 to shift from an equal split between the transistors Q5, Q6 to mostly flowing into the transistor Q6.

In one embodiment, the absolute value of the increased voltage level at node A is equal to the absolute value of the decreased voltage level at node B. This balanced differential voltage change does not change the voltage level at the base terminals 250 of the transistors Q3, Q4, in contrast to the common mode example described above. Thus, the common mode feedback loop does not react, and all of the differential input current flows through the transistors Q3, Q4 into the base terminals of the transistors Q1 and Q2, which results in a small signal differential gain of beta in transistors Q1 and Q2. Beta is the ratio of a total current in a collector terminal to a total current in a base terminal for a particular transistor (beta may also be called the common-emitter current gain).

For small differential input signals, the voltages at nodes A and B change in equal and opposite amounts.

Large Signal Differential Gain

An additional differential signal (e.g., increasing the difference between the input currents $I_{INP}$ and $I_{INN}$ by increasing $I_{INP}$ and/or decreasing $I_{INN}$) may cause one of the diode-configured transistors Q5 or Q6 to shut off, which changes the voltage level behavior at nodes A and B. Using the example above, if the difference between $I_{INP}$ and $I_{INN}$ is increased, the voltage level at node A increases, while the voltage level at node B decreases, which forces current from the second current source 230 to shift from an equal split between the transistors Q5, Q6 to mostly flowing into the transistor Q6. Once the transistor Q5 shuts off, the behavior of the intermediate stage 104 changes. Node B is now held at a fixed voltage with respect to the base 250 of the transistor Q4 by the voltage loop through the transistors Q6 and Q2 base-emitter voltages. The fixed voltage at node B with respect to the base voltage of the transistor Q4 keeps transistor Q4 from saturating. The transistor Q6 now controls the base voltage of the transistors Q3 and Q4 without the transistor Q5 to balance the base voltage.

Node A is not constrained by common mode feedback because the transistor Q5 is off. Thus, the voltage level at node A may continue to increase. The increasing voltage level at node A with respect to the base voltage of the transistor Q3 keeps transistor Q3 out of saturation. The large signal differential gain shifts to the transistor Q3. Thus, the differential current mode gain stage 104 shifts from separate common mode and differential mode actions to a merged action, where large differential mode signals cause a shift in the common mode level. The differential current mode gain stage 104 is stable in operation.

Differential Gain And Output Currents

Differential current signals applied to the emitter terminals 252, 256 of the transistors Q3 and Q4 result in a high differential gain at the high impedance nodes A and B. The transistors Q1, Q2 convert the differential current signals to first and second output currents $I_{OUTP}$ and $I_{OUTN}$, respectively, which enter the emitter terminals 236, 264 of the transistors Q1, Q2. Thus, the intermediate stage 104 drives the output stage 106 with the output currents $I_{OUTP}$ and $I_{OUTN}$.

In one embodiment, the output currents $I_{OUTP}$ and $I_{OUTN}$ in FIG. 2 are not current-limited. For example, as the voltage level at node A increases, the output current(s) $I_{OUTP}$ and/or $I_{OUTN}$ of the circuit 200 in FIG. 2 continually increases until a voltage drop across the resistors R1 and R2 causes a transistor in the circuit 200 to saturate from being too close to the supply voltage. This is a significant improvement over an op amp circuit (not shown) with a fixed maximum current, which is usually fixed by a bias current of the input stage.

Since the output currents $I_{OUTP}$ and $I_{OUTN}$ from the transistors Q1, Q2 provide current to the base terminals 304, 324 of the output transistors 300, 320, the output current of one embodiment of the intermediate stage 104 is limited only by the available supply voltage Vcc and the beta value of the transistors Q1–Q6.

In one embodiment, the op amp 100 in FIG. 1 further comprises a short-circuit protection circuit 107. The output current capability of the circuit 200 is greater than a short circuit, current limit control setpoint for supply voltages between about 2.7 to about 5 volts (i.e., the output current capability is limited by the short circuit current limit circuitry). Below about 2.7 volts, the output current capability drops in proportion to the supply voltage.

Stabilizing the Circuit

In one embodiment, when no output current is being drawn from the circuit 200, feedback capacitor 308 in the output stage 106 and capacitor 270 in the intermediate stage 104 are sufficient to stabilize the intermediate stage 104 and the circuit 200. When the circuit 200 is sourcing current, the diode current may shift from an equal split between the transistors Q5, Q6 to mostly flowing into the transistor Q6.

When the transistor Q6 conducts most of the bias current, the output (at best) may peak undesirably because the feedback capacitor 308 is no longer providing as much compensation compared to when no output current is drawn.

If the bias current level (current source 230) to the diodes Q5 and Q6 is about 10 uA, and the circuit 200 is sourcing a current as low as 1 mA, the collector current of the transistor Q2 may drop to below 10 uA. This drop makes the transistor Q2 much less effective at driving the base 260 of the transistor Q6 and the resistor R2 because the transconductance (gm) of the transistor Q2 has dropped to a low value. Instead of modulating the base voltage of the transistor Q6, most of the modulation occurs in the gm of the transistor Q2. The oscillation is caused by the feedback compensation capacitor 308 connected to node B via the transistors Q2, Q6. When the gm of the transistor Q2 becomes sufficiently low, the compensation is disabled, which causes peaking.

One solution to stabilizing the circuit 200 is reducing the value of the bias current source 230 to the diode transistors Q5, Q6. In one embodiment, the bias current source 230 is 4 uA, as shown in FIG. 2. With a reduced bias current to the diodes transistors Q5, Q6 across various process conditions, temperature conditions and output currents, the diode bias current is significantly smaller than the current in the transistor Q2, even when the circuit 200 is sourcing near its maximum current. In one embodiment, to stabilize the circuit 200, the current supply 230 should be smaller than current supplies 228 and 232. The magnitude 4 uA is an example in one embodiment.

Bias Circuit

Figure 3:
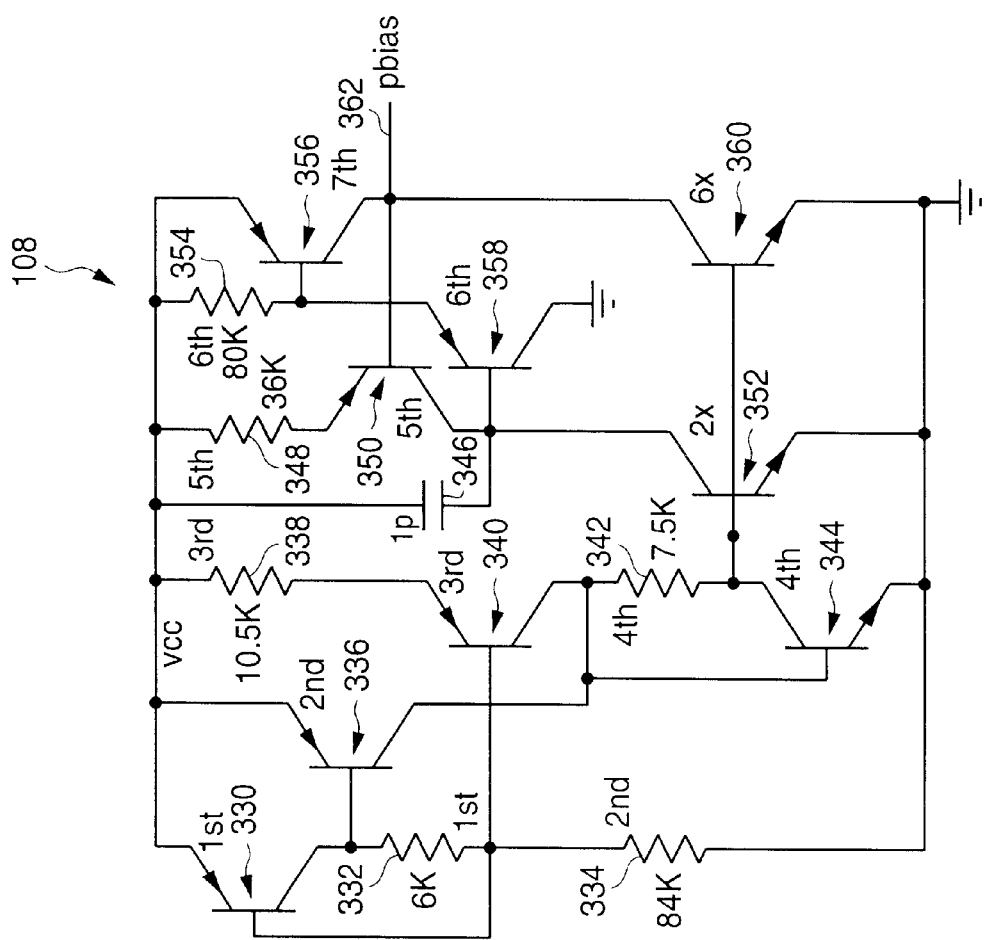
FIG. 3 illustrates one embodiment of a bias circuit of the low-voltage op amp in FIG. 1.

FIG. 3 illustrates one embodiment of a bias circuit 108 for the low-voltage op amp 100 in FIG. 1. The bias circuit 108 provides the op amp 100 in FIG. 1 with a low supply voltage Vcc. The bias circuit 108 comprises a first transistor 330, a second transistor 336, a third transistor 340, a fourth transistor 344, a fifth transistor 350, a first transistor set 352 (which, for clarity, is represented by a single transistor), a sixth transistor 358, a seventh transistor 356, a second transistor set 360 (which, for clarity, is represented by a single transistor), a capacitor 346, a first resistor 332, a second resistor 334, a third resistor 338, a fourth resistor 342, a fifth resistor 348, a sixth resistor 354 and a pbias output terminal 362. The pbias output terminal 362 can be coupled to base terminals of the transistors above the input stage 102 and the intermediate stage 104 in FIG. 1. In particular, pbias output terminal 362 may be coupled to low voltage op amp 100 at the "Vcc" terminal.

In one embodiment, the transistors 330, 336, 340, 350, 358 in FIG. 3 comprise pnp transistors. In one embodiment, the transistors 344, 356 comprise npn transistors. In one embodiment, the transistor set 352 comprises two npn transistors coupled in parallel. In one embodiment, the transistor set 360 comprises six npn transistors coupled in parallel. In one embodiment, the resistor 332 comprises a 6-kohm resistor, the resistor 334 comprises an 84-kohm resistor, the resistor 338 comprises a 10.5-kohm resistor, the resistor 342 comprises a 7.5-kohm resistor, the resistor 348 comprises a 36-kohm resistor, and the resistor 354 comprises an 80-kohm resistor. In one embodiment, the capacitor 346 comprises a 1-picofarad capacitor.

Figure 4:
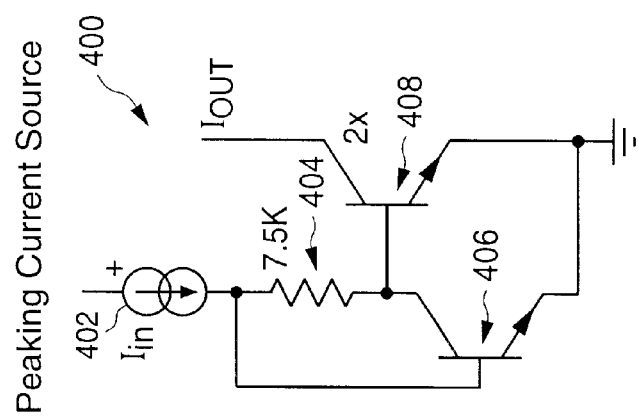
FIG. 4 illustrates one embodiment of a peaking current source circuit, which exemplifies the operation of portions of the bias circuit in FIG. 3.

Portions of the bias circuit 108 in FIG. 3 operate as a peaking current source circuit, which is exemplified by circuit 400 shown in FIG. 4.

FIG. 4 illustrates one embodiment of a peaking current source circuit 400, which exemplifies the operation of portions of the bias circuit 108 in FIG. 3. The peaking current source circuit 400 comprises an input current source 402, a resistor 404, a first transistor 406 and a second transistor 408. In one embodiment, the resistor 404 is a 1-kohm resistor, and the transistors 406, 408 are npn transistors.

The peaking current source circuit 400 in FIG. 4 has an output current $I_{OUT}$ that is about equal to an input current $I_{in}$ when the voltage drop across the resistor 404 is negligible. As the input current $I_{in}$ increases, the voltage drop across the resistor 404 increases. At high input currents, the output current $I_{out}$ actually decreases. Thus, the current source circuit 400 may be called a "peaking current source." The peak output current occurs at about $I_{in}*R=V_T$ (26 mV at room temperature), which makes the output current proportional to absolute temperature, as is desirable.

In FIG. 3, the bias circuit 108 comprises two cascaded peaking current source circuits and other components. The first cascaded peaking current source circuit comprises the resistor 342, transistor 344 and the transistor set 352. The second cascaded peaking current source circuit comprises the transistors 330, 336 and the resistor 332. The two cascaded peaking current source circuits reject a variation in reference current, which flows in resistor 334, caused by a variation in supply voltage Vcc.

The bias circuit 108 also comprises a linear current term added by the transistor and the resistor 338 to further dampen variation of circuit bias with respect to Vcc. The bias circuit 108 works well across various process and temperature conditions.

Figure 5:
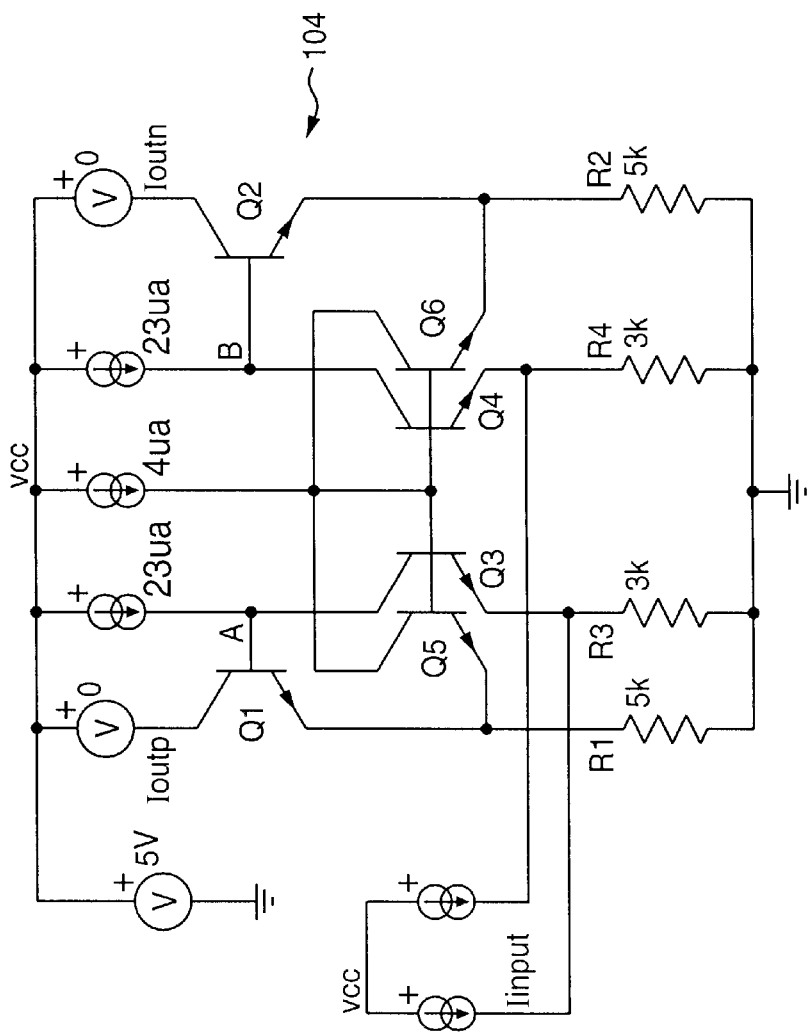
FIG. 5 illustrates one embodiment of a differential current mode gain stage within the low-voltage op amp of FIG. 1.

FIG. 5 illustrates one embodiment of a differential current mode gain stage within the low-voltage op amp 100 of FIG. 1.

Figure 6:
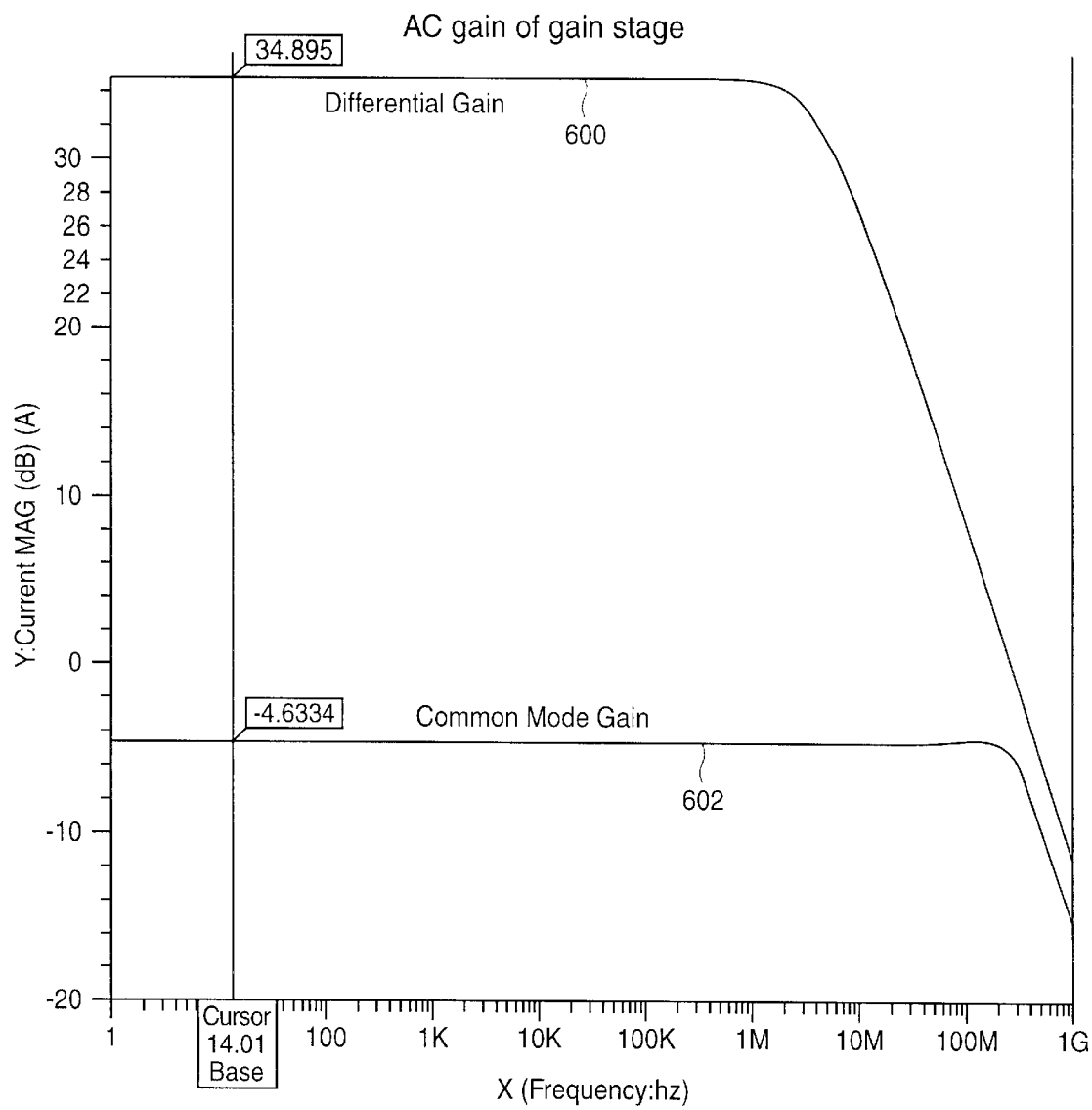
FIG. 6 illustrates an example of an alternating current (AC) differential mode gain and a common mode gain of the intermediate stage in FIG. 1 with respect to a frequency of an AC input signal.

FIG. 6 illustrates an example of an AC differential gain and a common mode gain of one embodiment of the intermediate stage 104 in FIG. 1 with respect to a frequency of an AC input signal. Differential gain is plotted by a first line 600, and common mode gain is plotted by a second line 602. In FIG. 6, gain is defined as $I_{OUT}/I_{IN}$. In one embodiment, the differential gain 600 is greater than the common mode gain 602 between a frequency range of about 1 Hz to about 100 MHz, as shown in Figure. In one embodiment, the differential gain 600 between about 1 Hz and about 1 MHz, when $I_{INP}$ and $I_{INN}$ are 180 degrees out of phase, is about 34.895 dB. In one embodiment, the common mode gain 602 between about 1 Hz to about 100 MHz, when $I_{INP}$ and $I_{INN}$ are in phase, is about −4.6334 dB. The relatively low common mode gain allows easy control of the common mode bias point.

FIG. 7 is a table of values associated with one embodiment of the op amp 100 in FIG. 1. Av+1 represents a closed-loop op amp voltage gain (of the op amp 100) of +1. Av+2 represents a closed-loop op amp gain of +2. A plurality of exemplifying supply voltages (1.2V, 2.7V, 5V and +/−2.5V) are applied to the op amp 100 of FIG. 1. Icc represents a supply current of the op amp 100. Vos represents an input offset voltage error of the op amp 100. Ib represents an input bias current at the base terminals 214, 222 of the transistors 210, 218 of the input stage 102, which receive the inv and ni signals. Ao represents an open loop gain of the op amp 100. PSRR represents a power supply rejection ratio of the op amp 100.

The above-described embodiments of the present invention are merely meant to be illustrative and not limiting. Various changes and modifications may be made without departing from the invention in its broader aspects. The appended claims encompass such changes and modifications within the spirit and scope of the invention.

What is claimed is:

1. A gain stage in an amplifier, the gain stage comprising a plurality of transistors, the gain stage configured to keep at least one transistor of the plurality of transistors out of saturation mode while operating with a supply voltage of less than two base-emitter voltages, receiving an input signal, generating a first output signal if the input signal comprises a common mode signal, and generating a second output signal if the input signal comprises a differential signal, the second output signal having a larger amplitude than the first output signal.

2. The gain stage of claim 1, configured to operate with a supply voltage of about 1.2 volts.

3. The gain stage of claim 1, configured to operate with a supply voltage of about 1.0 volt.

4. The gain stage of claim 1, wherein the input signal comprises a first input current and a second input current, the first input current having a larger amplitude than the second input current.

5. The gain stage of claim 1, wherein the input signal comprises a first input current and a second input current, the first input current having a different phase than the second input current.

6. The gain stage of claim 1, wherein at least a portion of the plurality of transistors implement a common mode feedback loop, the common mode feedback loop configured to limit an amplitude of an amplified output signal if the input signal comprises a common mode signal.

7. The gain stage of claim 1, configured to output a small gain signal if the input signal comprises a small differential signal.

8. The gain stage of claim 7, wherein the small gain signal associated with the small differential input signal is substantially equal to a beta parameter of at least one transistor of the plurality of transistors in the gain stage.

9. The gain stage of claim 1, wherein the gain stage enters a merged common mode and differential mode operation if the input signal comprises a large differential input signal.

10. The gain stage of claim 1, wherein a large differential input signal causes a shift in a common mode level.

11. The gain stage of claim 1, configured to output at least one output current that is not limited by a fixed bias input current.

12. The gain stage of claim 1, wherein a signal output by the gain stage is limited only by the supply voltage and at least one beta value of the transistors.

13. The gain stage of claim 1, comprising:
a first transistor comprising a first collector terminal, a first base terminal and a first emitter terminal, the first collector terminal coupled to a first output terminal, the first base terminal coupled to a first power source, and the first emitter terminal coupled to a first resistor;
a second transistor comprising a second collector terminal, a second base terminal and a second emitter terminal, the second collector terminal coupled to a second output terminal, the base terminal coupled to a second power source, and the second emitter terminal coupled to a second resistor;
a third transistor comprising a third collector terminal, a third base terminal and a third emitter terminal, the third collector terminal coupled to the first power source, the third base terminal coupled to a third power source, and the third emitter terminal coupled to a third resistor;
a fourth transistor comprising a fourth collector terminal, a fourth base terminal and a fourth emitter terminal, the fourth collector terminal coupled to the second power source, the fourth base terminal coupled to the third power source, and the fourth emitter terminal coupled to a fourth resistor;
a fifth transistor comprising a fifth collector terminal, a fifth base terminal and a fifth emitter terminal, the fifth collector terminal coupled to the third power source, the fifth base terminal coupled to the third power source, and the fifth emitter terminal coupled to the first resistor; and
a sixth transistor comprising a sixth collector terminal, a sixth base terminal and a sixth emitter terminal, the sixth collector terminal coupled to the third power source, the sixth base terminal coupled to the third power source, and the sixth emitter terminal coupled to a second resistor.

14. An operational amplifier comprising:
an input stage configured to receive at least one input signal and operate with a supply voltage of less than two base-emitter voltages;
an intermediate stage coupled to the input stage, the intermediate stage comprising a plurality of transistors, the intermediate stage configured to keep at least one transistor of the plurality of transistors out of saturation mode while operating with a supply voltage of less than two base-emitter voltages, receiving a signal from the input stage, generating a first output signal if the signal from the input stage comprises a common mode signal, and generating a second output signal if the signal from the input stage comprises a differential signal, the second output signal having a larger amplitude than the first output signal; and
an output stage coupled to the intermediate stage, the output stage configured to receive the first or the second output signal from the intermediate stage.

15. The operational amplifier of claim 14, wherein the operational amplifier is configured to operate with a supply voltage of about 1.2 volts.

16. The operational amplifier of claim 14, wherein the operational amplifier is configured to operate with a supply voltage of about 1.0 volts.

17. A method of providing a signal gain, the method comprising: operating with a supply voltage of less than two base-emitter voltages volts;
generating a first output signal if an input signal comprises a common mode signal;
generating a second output signal if the input signal comprises a differential signal, wherein the second output signal has a larger amplitude than the first output signal; and
keeping the at least one transistor in a circuit out of saturation mode while generating the first and second output signals.

* * * * *